United States Patent
Suzuki

(10) Patent No.: US 12,185,508 B2
(45) Date of Patent: Dec. 31, 2024

(54) BUS BAR HEAT DISSIPATION STRUCTURE AND INVERTER DEVICE

(71) Applicant: MEIDENSHA CORPORATION, Tokyo (JP)

(72) Inventor: Shota Suzuki, Numazu (JP)

(73) Assignee: MEIDENSHA CORPORATION, Tokyo (JP)

( * ) Notice: Subject to any disclaimer, the term of this patent is extended or adjusted under 35 U.S.C. 154(b) by 0 days.

(21) Appl. No.: 18/569,967

(22) PCT Filed: Jun. 7, 2022

(86) PCT No.: PCT/JP2022/022866
§ 371 (c)(1),
(2) Date: Dec. 13, 2023

(87) PCT Pub. No.: WO2022/264864
PCT Pub. Date: Dec. 22, 2022

(65) Prior Publication Data
US 2024/0276684 A1    Aug. 15, 2024

(30) Foreign Application Priority Data
Jun. 14, 2021  (JP) ................. 2021-098711

(51) Int. Cl.
H05K 7/20      (2006.01)
H02M 7/00      (2006.01)

(52) U.S. Cl.
CPC ............ *H05K 7/209* (2013.01); *H02M 7/003* (2013.01); *H05K 7/20481* (2013.01); *H05K 7/20509* (2013.01)

(58) Field of Classification Search
CPC ........ H02M 7/003; H02M 7/48; H05K 7/209; H05K 7/20481; H05K 7/20509
See application file for complete search history.

(56) References Cited

U.S. PATENT DOCUMENTS

| | | | |
|---|---|---|---|
| 2011/0127061 A1* | 6/2011 | Gotou | H02M 7/003 174/68.2 |
| 2015/0305188 A1 | 10/2015 | Maeda et al. | |
| 2018/0261991 A1* | 9/2018 | Gregoire | H02M 7/003 |

FOREIGN PATENT DOCUMENTS

| | | | |
|---|---|---|---|
| JP | 2009-021445 A | | 1/2009 |
| JP | 2014-128084 A | | 7/2014 |
| JP | 2015084609 A | * | 4/2015 |
| JP | 2017017861 A | * | 1/2017 |

(Continued)

OTHER PUBLICATIONS

Machine translation for JP 2015084609.*

*Primary Examiner* — Thienvu V Tran
*Assistant Examiner* — Yahveh Comas Torres
(74) *Attorney, Agent, or Firm* — Foley & Lardner LLP

(57) ABSTRACT

In an inverter device 1, a pair of bus bars P and N are disposed along each other between a smoothing capacitor 2 and a power semiconductor module 3 and are connected to the smoothing capacitor 2 and the power semiconductor module 3. A heat sink 5 is disposed between the bus bars P and N along the bus bars P and N. Insulating members 6 are disposed between the bus bar P and the heat sink 5 and between the bus bar N and the heat sink 5. A part of the heat sink 5 is connected to a case 4 on which the power semiconductor module 3 is mounted.

3 Claims, 4 Drawing Sheets

(56) References Cited

FOREIGN PATENT DOCUMENTS

| JP | 2018067998 A | * | 4/2018 | |
|----|---|---|---|---|
| JP | 2018-166400 A | | 10/2018 | |
| JP | 2020156206 A | * | 9/2020 | |
| WO | WO-2019208406 A1 | * | 10/2019 | ............... H01G 2/04 |

* cited by examiner

BUS BAR HEAT DISSIPATION STRUCTURE AND INVERTER DEVICE

TECHNICAL FIELD

The present invention relates to a bus bar heat dissipation structure to be applied to an inverter device.

BACKGROUND TECHNOLOGY

An inverter device is one which converts DC power into AC power to drive a motor and the like.

A smoothing capacitor for smoothing DC power is mounted on a DC power part of the inverter device. The conversion from DC power into AC power is carried out by switching operation of a power semiconductor module such as an IGBT.

Bus bars (specifically, a bus bar P on the positive electrode side and a bus bar N on the negative electrode side) are usually used for the electrical connection between the smoothing capacitor and the power semiconductor module. In addition, the bus bar connected to the positive electrode of the smoothing capacitor is arranged along the bus bar connected to the negative electrode of the smoothing capacitor, thereby achieving a reduction in inductance.

In a conventional one, it is necessary to ensure an insulation distance according to, for example, the voltage and the like of the inverter device in the bus bar P and the bus bar N for DC power input. In order to save a space while ensuring the insulation, the bus bar P and the bus bar N are integrally molded with resin and it is fixed to, for example, an inverter case with a screw via a collar integrally molded at the same time. In the DC-power-input bus bars, it is necessary to design the cross-sectional area so as to have a current density which satisfies the increasing of the heat resistant temperature and internal air temperature of the resin for the integral molding.

However, since the DC-power-input bus bars are located between the smoothing capacitor and the power semiconductor module, from the point of view of the space restriction of the structure and the inductance reduction of the smoothing capacitor, it is often difficult to suppress the generation of heat by increasing the cross-sectional areas of the bus bars. It has therefore been required to provide a heat dissipation structure to the DC-power-input bus bars. As a heat dissipation structure of the DC-power-input bus bars, for example, a heat dissipation structure provided to the inverter device disclosed in a patent document 1 can be cited.

PRIOR ART REFERENCE(S)

Patent Document(s)

Patent Document 1: Japanese Patent Application Publication No. 2009-21445

SUMMARY OF THE INVENTION

In a conventional heat dissipation structure disclosed in, for example, the patent document 1, a heat sink having a large area is required at the lower part of the bus bar P and the bus bar N, and it is not preferable to reduce the size of the inverter device.

The present invention is made in consideration of such a technical problem, and an object of the present invention is to improve the rigidity and the heat dissipation performance of bus bars connected to a smoothing capacitor and a power semiconductor module of an inverter device and to reduce the size of the inverter device.

Therefore, the present invention, in one aspect thereof, is a bus bar heat dissipation structure including: a pair of bus bars disposed along each other between a smoothing capacitor and a power semiconductor module and connected to the smoothing capacitor and the power semiconductor module; a heat sink disposed between the pair of the bus bars along the pair of the bus bars; insulating members disposed between one of the pair of the bus bars and the heat sink and between the other of the pair of the bus bars and the heat sink; and a case on which the power semiconductor module is mounted, wherein the heat sink includes: a heat dissipation main body part disposed between the pair of the bus bars; and a case-side fixing leg part fastened to the case, at one end side of the heat dissipation main body part.

In one aspect of the present invention, the bus bar heat dissipation structure further includes a resin member for integrating the pair of the bus bars with the heat sink.

In one aspect of the present invention, the bus bar heat dissipation structure further includes a substrate formed with a fixing hole, wherein the heat sink further includes a substrate-side fixing leg part fastened to the substrate via the fixing hole, at an other end side of the heat dissipation main body part, and wherein a pattern connected to an electronic component mounted on the substrate is provided at a periphery of the fixing hole of the substrate.

The present invention, in one aspect thereof, is an inverter device including the bus bar heat dissipation structure mentioned above.

According to the above present invention, the rigidity and the heat dissipation performance of the bus bars connected to the smoothing capacitor and the power semiconductor module of the inverter device can be improved and the size of the inverter device can be reduced.

MODE FOR IMPLEMENTING THE INVENTION

Figure 1:
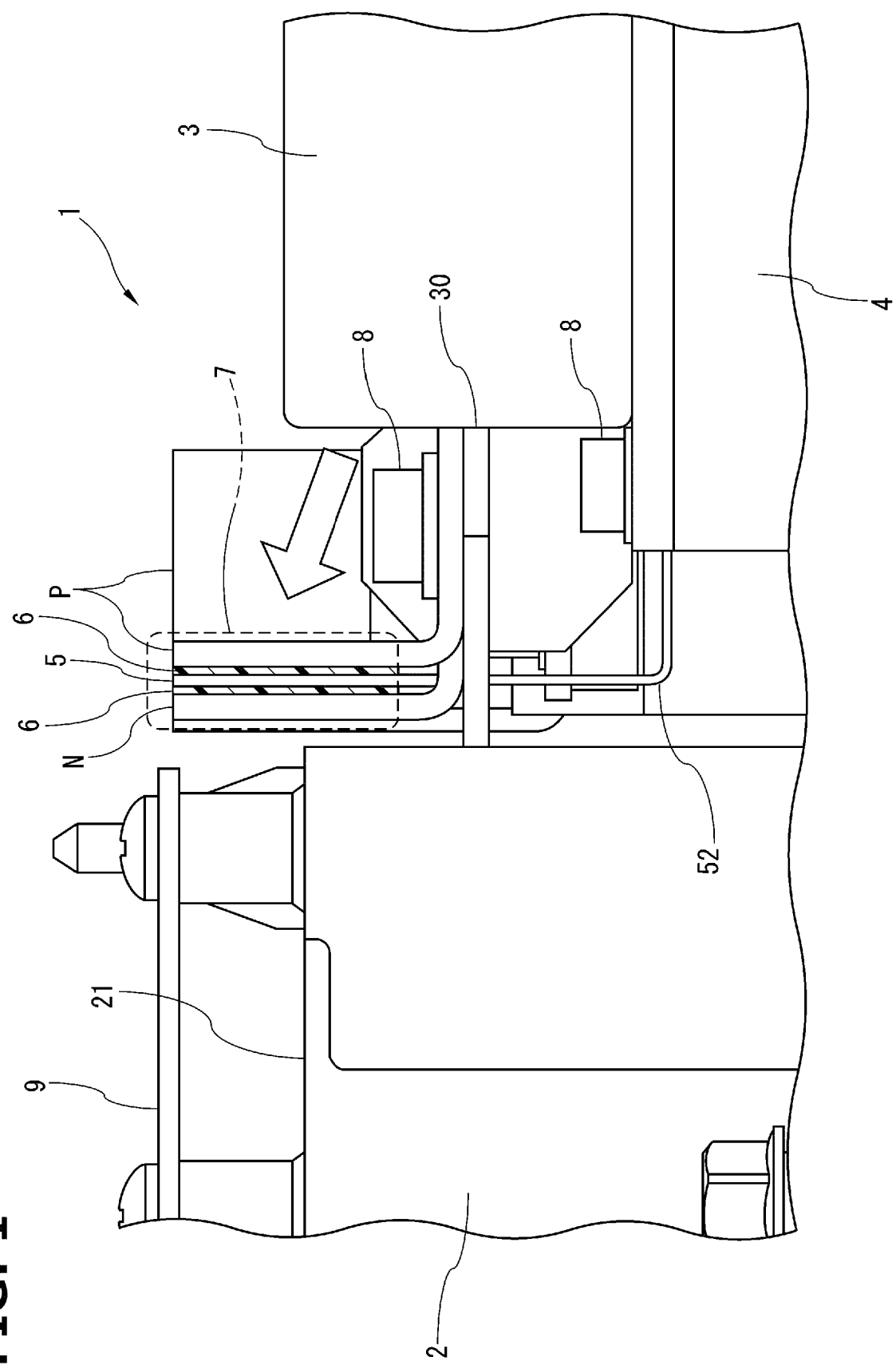
FIG. 1 is a side view of a bus bar heat dissipation structure in an inverter device of a first embodiment in the present invention.

In the following, an embodiment of the present invention will be explained while referring to the drawings.

First Embodiment

An inverter device 1 to which a bus bar heat dissipation structure as one embodiment of the present invention shown in FIG. 1 has been applied is provided with a smoothing capacitor 2, a power semiconductor module 3 and a pair of bus bars P and N.

The power semiconductor module 3 is mounted on a case 4 so as to be parallel to the smoothing capacitor 2, at a position near the smoothing capacitor 2.

The bus bar P which is one of the bus bars corresponds to a positive electrode bus bar. The bus bar N which is the other of the bus bars corresponds to a negative electrode bus bar. The bus bars P and N are disposed along each other between the smoothing capacitor 2 and the power semiconductor module 3, and are connected to the smoothing capacitor 2 and the power semiconductor module 3.

In addition, as shown in FIGS. 1 and 3, a heat sink 5 is disposed between the bus bars P and N along the bus bars P and N. Moreover, insulating members 6 are disposed between the bus bar P and the heat sink 5 and between the bus bar N and the heat sink 5. Then, the bus bars P and N and the heat sink 5 are integrated with a resin member 7.

An example of a specific mode of the bus bars P and N, the heat sink 5, the insulating members 6 and the resin member 7 will be explained while referring to FIG. 3.

(Bus Bar P)

The bus bar P is made of a well-known steel material such as copper and aluminum, and is integrally provided with a bus-bar-P main body part P1, module-side terminal parts P2 and a capacitor-side terminal part P3.

The bus-bar-P main body part P1 is formed in a rectangular plate shape bent in a crank shape such that the capacitor-side terminal part P3 is arranged parallel to a capacitor-side terminal part N3 of the bus bar N. In addition, the bus-bar-P main body part P1 is formed with through holes P4 through which projection portions 74 of the resin member 7 (locking main body part 71) pass.

The module-side terminal parts P2 are composed of three (three-phase) terminals which protrude vertically to the bus-bar-P main body part P1 and are fastened to a terminal stand 30 of the power semiconductor module 3 by fixing tools 8 such as screws.

The capacitor-side terminal part P3 is composed of a single terminal which protrudes toward the direction opposite to the module-side terminal parts P2 on one end side of the bus-bar-P main body part P1 and is fastened to a terminal stand 20 of the smoothing capacitor 2 by a fixing tool 8.

(Bus Bar N)

Similar to the bus bar P, the bus bar N is made of a well-known steel material such as copper and aluminum, and is provided with a bus-bar-N main body part N1, module-side terminal parts N2 and a capacitor-side terminal part N3.

The bus-bar-N main body part N1 is formed in a rectangular plate shape which is bent such that the capacitor-side terminal part N3 is arranged parallel to the capacitor-side terminal part P3 of the bus bar P. In addition, the bus-bar-N main body part N1 is formed with through holes N4 through which the projection portions 74 of the resin member 7 pass.

The module-side terminal parts N2 are composed of three (three-phase) terminals which protrude vertically to the bus-bar-N main body part N1 and are fastened to the terminal stand 30 of the power semiconductor module 3 by fixing tools 8 so as to be parallel to the respective three module-side terminal parts P2 of the bus bar P.

The capacitor-side terminal part N3 is composed of a single terminal which protrudes toward the same direction as that of the module-side terminal parts N2 on one end side of the bus-bar-N main body part N1, is arranged parallel to the capacitor-side terminal part P3 of the bus bar P and is fastened to the terminal stand 20 of the smoothing capacitor 2 by a fixing tool 8.

(Heat Sink 5)

The heat sink 5 is made of a well-known thermal conductive steel material such as copper steel, iron steel, copper alloy and aluminum alloy, and is provided with a heat dissipation main body part 51 and a case-side fixing leg part 52.

The heat dissipation main body part 51 is formed in a rectangular plate shape and is disposed between the bus-bar-P main body part P1 and the bus-bar-N main body part N1. In addition, the heat dissipation main body part 51 is formed with through holes 53 through which the projection portions 74 of the resin member 7 pass.

The case-side fixing leg part 52 is fastened to the case 4 by a fixing tool 8, on one side of the heat dissipation main body part 51.

(Insulating Member 6)

The insulating members 6 are made of a well-known resin material or heat conductive insulating material, are formed in rectangular sheet shapes, and are disposed between the bus bar P and the heat sink 5 and between the bus bar N and the heat sink 5. In addition, the insulating members 6 are each formed with through holes 61 through which the respective projection portions 74 of the resin member 7 pass.

(Resin Member 7)

The resin member 7 is made of heat resistance and insulating resin such as polyphenylene sulfide (PPS) based resin and polybutylene terephthalate (PBT) based resin, and is provided with a locking main body part 71, a bus-bar-P locking part 72 and a capacitor locking part 73.

The locking main body part 71 is formed in an L-shaped plate shape in cross section so as to come in contact with the bus bar P and to be lockable to the bus bar P, the heat sink 5 and the bus bar N. In addition, as shown in FIG. 3, the locking main body part 71 is provided with projection portions 74 which pass through the through holes P4, 61, 53, 61 and N4 of the bus bar P, the insulating member 6, the heat sink 5, the insulating member 6 and the bus bar N.

The bus-bar-P locking part 72 is formed in a plate shape so as to be lockable to the bus bar P at one end of the locking main body part 71. In addition, a pair of grooves 75 into which the respective bus-bar-P main body part P1 and bus-bar-N main body part N1 are inserted is provided between the bus-bar-P locking part 72 and the locking main body part 71.

The capacitor locking part 73 is formed in a plate shape so as to be lockable to the case 4 at a part close to the other end of the locking main body part 71. In addition, the capacitor locking part 73 is provided with a projection portion 76 to be inserted into an insertion hole 22 in a housing 21 of the smoothing capacitor 2.

(Assembling of Bus Bar Heat Dissipation Structure)

Figure 2:
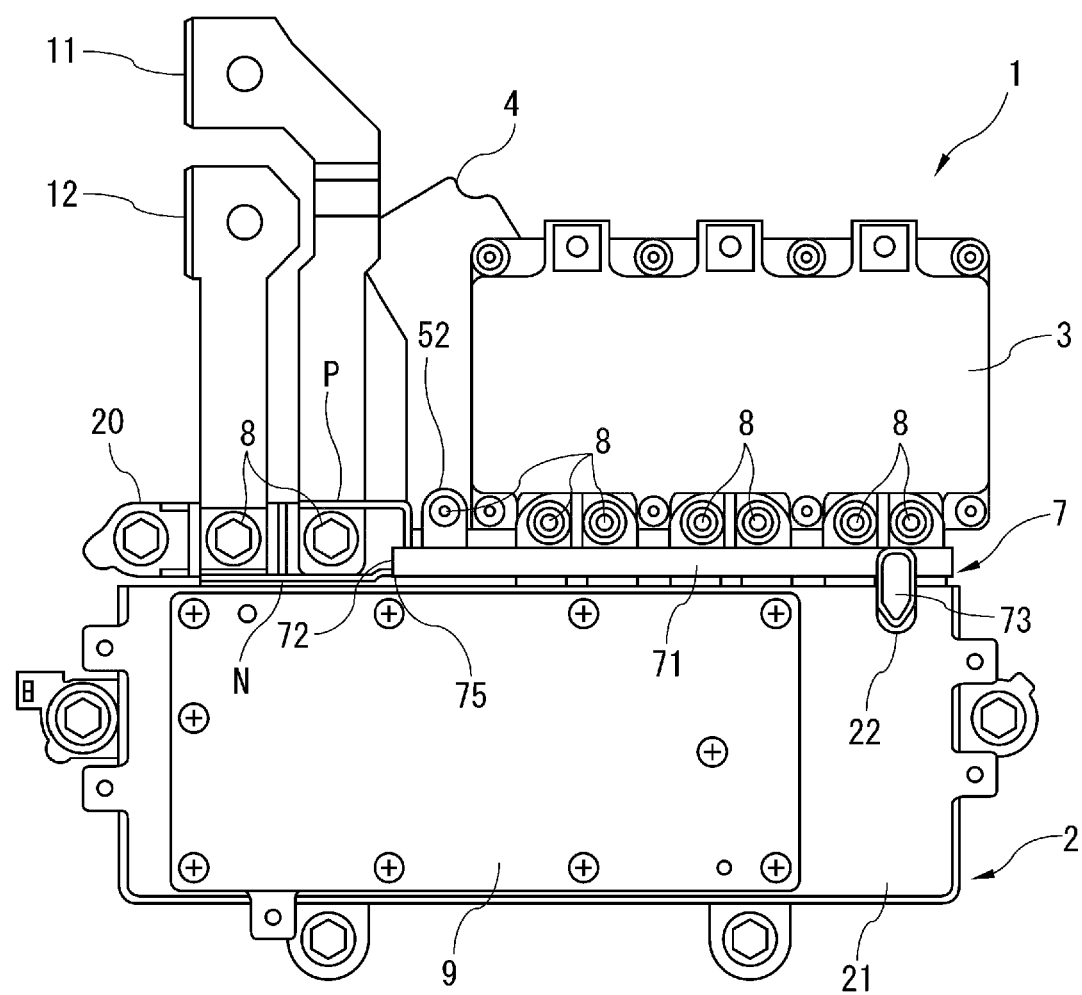
FIG. 2 is a plane view of the bus bar heat dissipation structure of the first embodiment.

An example of an assembly procedure of the bus bar heat dissipation structure in the present embodiment will be explained while referring to FIGS. 1 to 3.

Figure 3A:
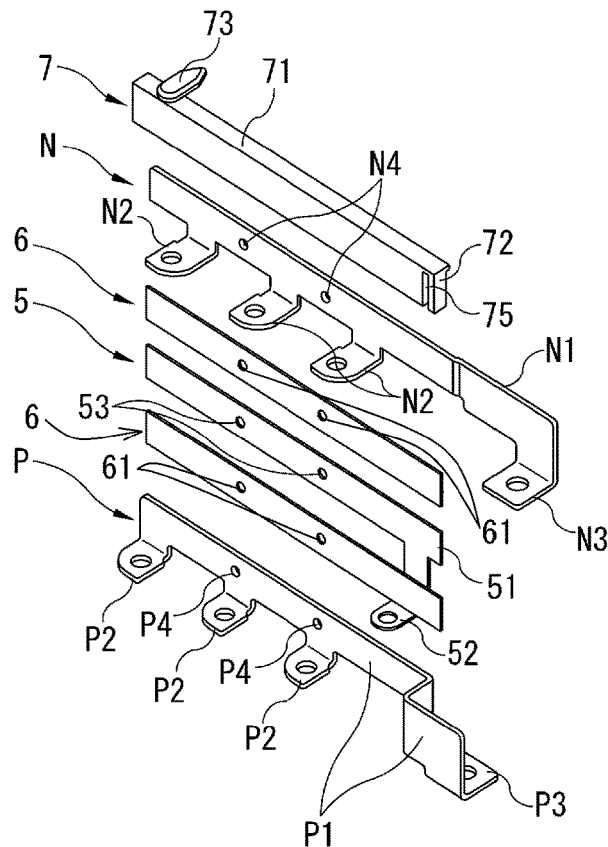
FIG. 3(a) is a perspective exploded view of the bus bar heat dissipation structure in the first embodiment.
Figure 3B:
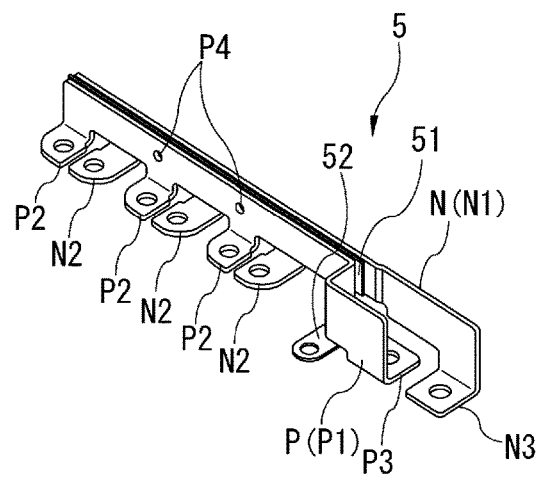
FIG. 3(b) is a perspective view which shows the arrangement relation of a positive electrode bus bar, a negative electrode bus bar, a heat sink and insulating members in the heat dissipation structure.

First, the insulating members 6 are interposed between the bus bar P and the heat sink 5 and between the bus bar N and the heat sink 5 as shown in FIGS. 1 and 3(a), and the bus bars P and N, the heat sink 5 and the insulating members 6 are assembled as shown in FIG. 3(b).

Figure 3C:
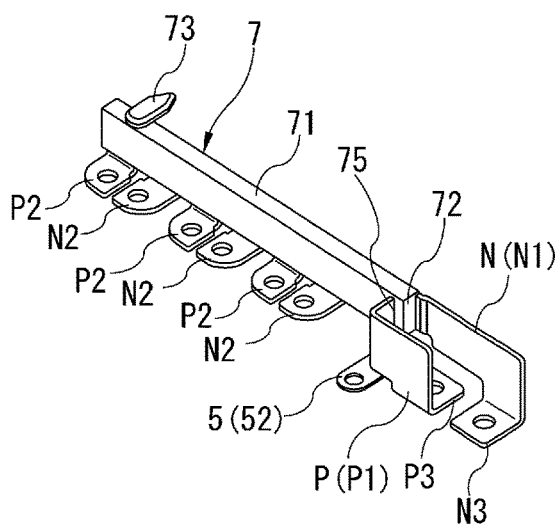
FIG. 3(c) is a perspective view of the heat dissipation structure viewed from a power semiconductor module side.
Figure 3D:
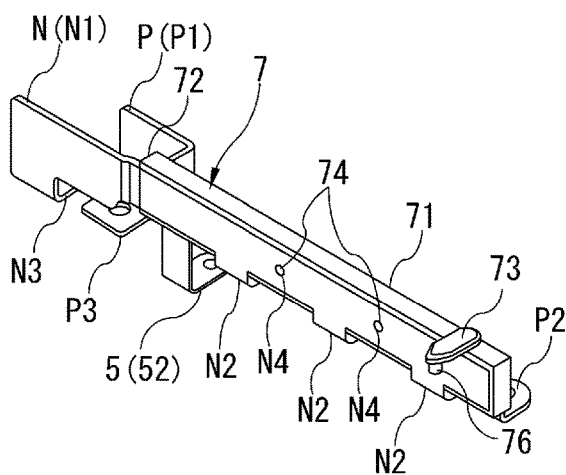
FIG. 3(d) is a perspective view of the heat dissipation structure viewed from a smoothing capacitor side.

Next, the bus-bar-P main body part P1 and the bus-bar-N main body part N1 are inserted into the grooves 75 of the resin member 7 as shown in FIGS. 3(c) and 3(d). In addition, the projection portions 74 of the resin member 7 are inserted into the through holes P4, 61, 53, 61 and N4 of the bus bar P, the insulating member 6, the heat sink 5, the insulating member 6 and the bus bar N.

Then, as shown in FIG. 1, in a state in which the projection portion 74 of the capacitor locking part 73 of the resin member 7 is inserted into the through hole 22 of the housing 21 of the smoothing capacitor 2, the module-side terminal parts P2 and N2 of the bus bars P and N are fastened to the terminal stand 30 of the power semiconductor module 3 by the fixing tools 8. In addition, the case-side fixing leg part 52 of the heat sink 5 is fastened to the case 4 by the fixing tool 8. Moreover, the capacitor-side terminal parts P3 and N3 of the bus bars P and N are each fastened to the terminal stand 20 of the smoothing capacitor 2 by the fixing tools 8, together with conductors 11 and 12 of FIG. 2 which are connected to a DC power supply part (not shown) of the inverter device 1. At this time, the bus bars P and N, the heat sink 5 and the insulating members 6 are integrated by the resin member 7.

In addition, in the present embodiment, the insulating members 6 are formed separately from the resin member 7. Since the resin member 7 has insulation properties, a mode may be used in which the insulating members 6 and the resin member 7 are integrally molded in advance. According to this mode, as compared with the configuration in which the insulating members 6 are formed separately from the resin member 7, the number of assembly processes can be reduced.

Effects of the Present Embodiment

According to the bus bar heat dissipation structure mentioned above, the heat sink 5, the bus bars P and N and the insulating members 6 are integrated, and thereby the heat generated at the bus bars P and N can be dissipated to the case 4 via the heat dissipation main body part 51 and the case-side fixing leg part 52 of the heat sink 5 and the rigidity of the integrated bus bars P and N increases.

In addition, by the above integration between the smoothing capacitor 2 and the power semiconductor module 3, the case-side leg part 52 of the heat sink 5 can be disposed at a part which is a position immediately before current is shunted from the bus bars P and N to the power semiconductor module 3 and at which the current density is the highest.

Moreover, since it is not necessary to provide a heat sink having a large area at the lower part of the bus bar P and the bus bar N as shown in the heat dissipation structure of the patent document 1, the size of the inverter device can be reduced. In addition, the integrated bus bars P and N can be disposed between electronic components having low noise resistance (after-mentioned substrate 9 and electronic components on the substrate 9) and the power semiconductor module 3. Consequently, the electric field of noises generated from the power semiconductor module 3 toward the direction shown by a white arrow in FIG. 1 is shielded by the bus bars P and N and the magnetic field of the noises is shielded by the heat sink 5, thereby suppressing the occurrence of the malfunction of the electronic components.

Therefore, according to the bus bar heat dissipation structure of the present embodiment, the heat dissipation properties and the rigidity of the bus bars P and N connected to the smoothing capacitor 2 and the power semiconductor module 3 of the inverter device 1 are improved and the size of the inverter device 1 can be reduced. In addition, noises from the power semiconductor module 3 to another electronic component can also be shielded.

Second Embodiment

The inverter device 1 of FIG. 1 is provided with the substrate 9 on which electronic components such as a CPU for executing, for example, the generation of a switching signal of a semiconductor power module and capacitor are mounted. In a three-phase DC capacitor (hereinafter is referred to as a "Y capacitor") mounted on the substrate 9, there is case where its neutral point grounding (GND connection) is required. In the conventional one, by connecting between the grounding terminal of the substrate 9 and the case 4 with a bus bar, a harness or the like, and by grounding the case 4, the Y capacitor of the substrate 9 is grounded.

Figure 4A:
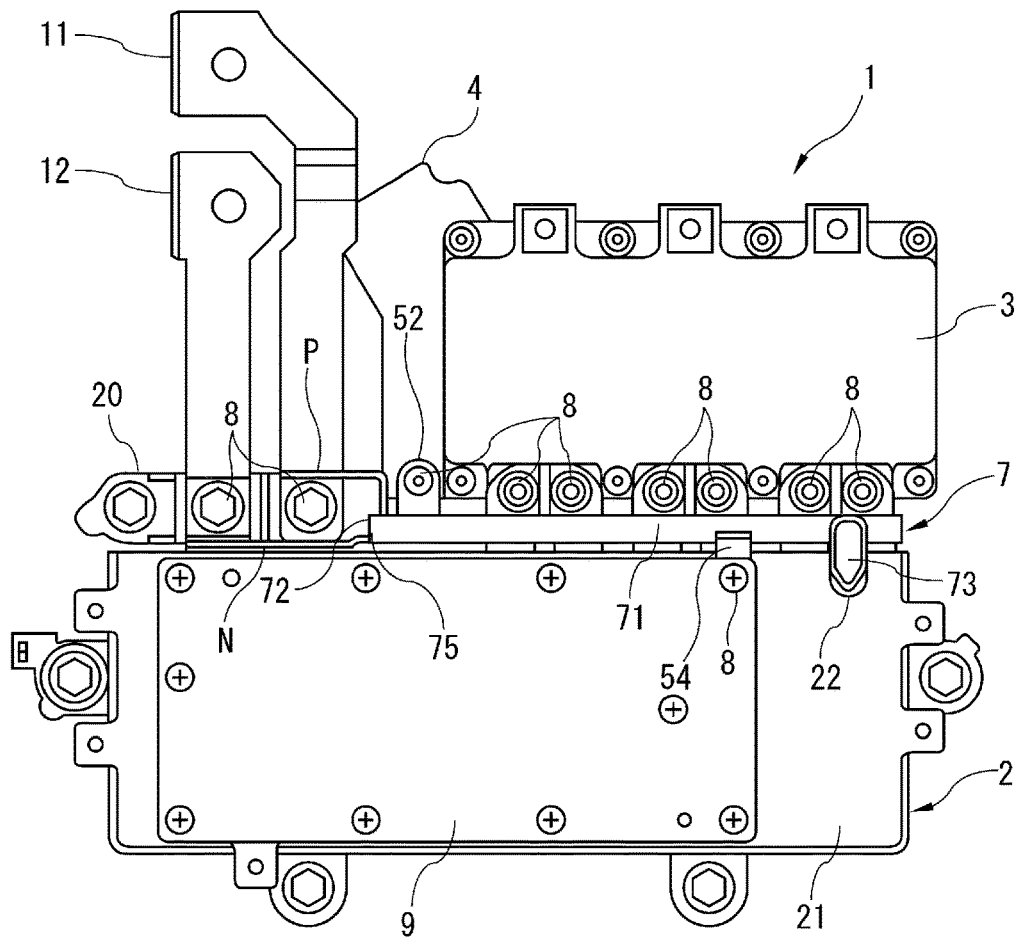
FIG. 4(a) is a plane view of the bus bar heat dissipation structure in a second embodiment.
Figure 4B:
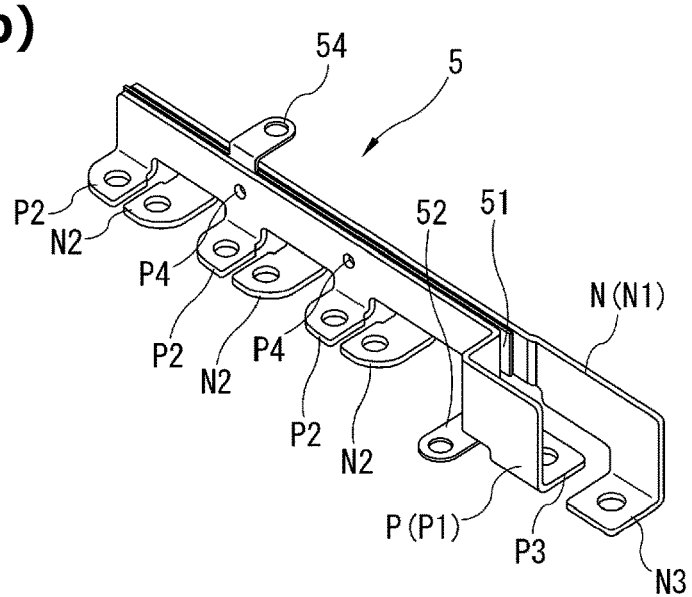
FIG. 4(b) is a perspective view which shows the arrangement relation of the positive electrode bus bar, the negative electrode bus bar and the heat sink in the heat dissipation structure.

Therefore, the heat sink 5 in the present embodiment shown FIG. 4 is further provided with a substrate-side fixing leg part 54 to be fastened to the substrate 9 and the housing 21 of the smoothing capacitor 2 via a fixing hole formed to the substrate 9, in a mode of the heat sink 5 in the first embodiment.

The substrate-side fixing leg part 54 is provided in the direction opposite to the case-side fixing leg part 52 at the other end side (substrate 9 side) of the heat dissipation main body part 51, and is fastened to the substrate 9 and the housing 21 of the smoothing capacitor 2 via a fixing hole of the substrate 9 by a conductive fixing tool 8. The substrate 9 is provided with patterns to which electronic components such as a CPU and a Y capacitor mounted on the substrate 9 are connected. Moreover, the patterns are also provided to the periphery of the fixing hole (part with which the fixing tool 8 comes in contact).

According to the bus bar heat dissipation structure mentioned above, the substrate-side fixing leg part 54 that is a part of the heat sink 5 is fastened to the housing 21 of the smoothing capacitor 2 via a fixing hole of the substrate 9, and a grounding terminal of the Y capacitor on the substrate 9 which is positioned near the bus bars P and N is electrically connected to the case 4 via the heat sink 5. Then, the case 4 is grounded, and thereby the grounding of the Y capacitor of the substrate 9 is ensured.

Therefore, according to the bus bar heat dissipation structure of the second embodiment mentioned above, in addition to the working effects of the bus bar heat dissipation structure of the first embodiment, the grounding of components inside the substrate 9 can be ensured. In addition, a bus bar and harness for connecting a grounding terminal of a substrate with the case 4 according to conventional technique become unnecessary.

In addition, the bus bar heat dissipation structure of the first and second embodiments can also be applied to a bus bar which connects a DC power source (for example, a battery) other than the smoothing capacitor 2 with the power semiconductor module 3.

The invention claimed is:
1. A bus bar heat dissipation structure comprising:
a pair of bus bars disposed along each other between a smoothing capacitor and a power semiconductor module and connected to the smoothing capacitor and the power semiconductor module;
a heat sink disposed between the pair of the bus bars along the pair of the bus bars;
insulating members disposed between one of the pair of the bus bars and the heat sink and between an other of the pair of the bus bars and the heat sink;

a case on which the power semiconductor module is mounted; and a substrate formed with a fixing hole, wherein the heat sink includes:
- a heat dissipation main body part disposed between the pair of the bus bars;
- a case-side fixing leg part fastened to the case, at one end side of the heat dissipation main body part; and
- a substrate-side fixing leg part fastened to the substrate via the fixing hole, at an other end side of the heat dissipation main body part, and wherein a pattern connected to an electronic component mounted on the substrate is provided at a periphery of the fixing hole of the substrate.

2. The bus bar heat dissipation structure according to claim 1, further comprising a resin member for integrating the pair of the bus bars with the heat sink.

3. An inverter device comprising the bus bar heat dissipation structure according to claim 1.

* * * * *